United States Patent
Gordon et al.

(10) Patent No.: US 6,803,158 B1
(45) Date of Patent: Oct. 12, 2004

(54) PHOTOMASK AND METHOD FOR FORMING AN OPAQUE BORDER ON THE SAME

(75) Inventors: Joseph Stephen Gordon, Gardiner, NY (US); Gregory P. Hughes, Austin, TX (US); Franklin Dean Kalk, Austin, TX (US); Hakki Ufuk Alpay, Poughquag, NY (US)

(73) Assignee: DuPont Photomasks, Inc., Round Rock, TX (US)

( * ) Notice: Subject to any disclaimer, the term of this patent is extended or adjusted under 35 U.S.C. 154(b) by 163 days.

(21) Appl. No.: 10/108,222

(22) Filed: Mar. 27, 2002

Related U.S. Application Data

(60) Provisional application No. 60/279,060, filed on Mar. 27, 2001.

(51) Int. Cl.[7] .............................. G03F 9/00; G03C 5/00
(52) U.S. Cl. ............................. 430/5; 430/396; 430/323
(58) Field of Search ............................ 430/5, 396, 323

(56) References Cited

U.S. PATENT DOCUMENTS 4,797,334 A * 1/1989 Glendinning ................. 430/5
5,741,613 A 4/1998 Moon et al. ................... 430/5

* cited by examiner

Primary Examiner—Saleha R. Mohamedulla
(74) Attorney, Agent, or Firm—Baker Botts L.L.P.

(57) ABSTRACT

A photomask and a method for forming an opaque border on the same are disclosed. In an example method of manufacturing a photomask, no more than one patterning operation is used to form a mask field with an opaque border substantially surrounding the mask field. The border region may be substantially covered by an opaque material, and features in the mask field may be free from the opaque material. When the photomask is used to expose a pattern on an object, the opaque border may substantially prevent electromagnetic radiation (EMR) from exposing portions of the object outside the field of exposure associated with the mask field. The operation of forming the mask field may include forming an insulating clear region surrounding the features and leaving the border region outside the insulating clear region. The opaque layer may be deposited by electroplating or spraying an opaque material onto the border region.

21 Claims, 4 Drawing Sheets

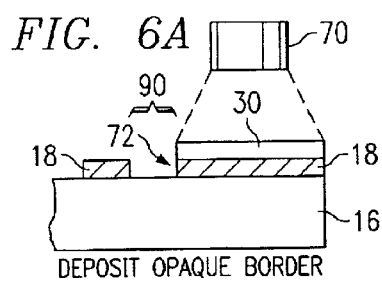
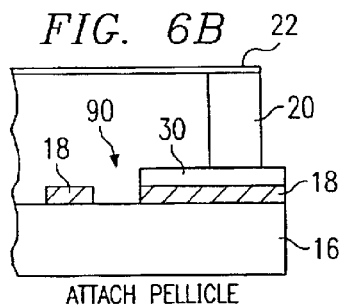
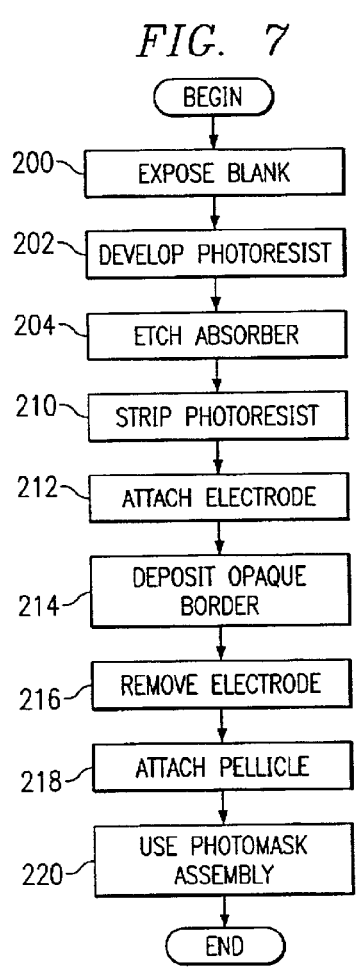
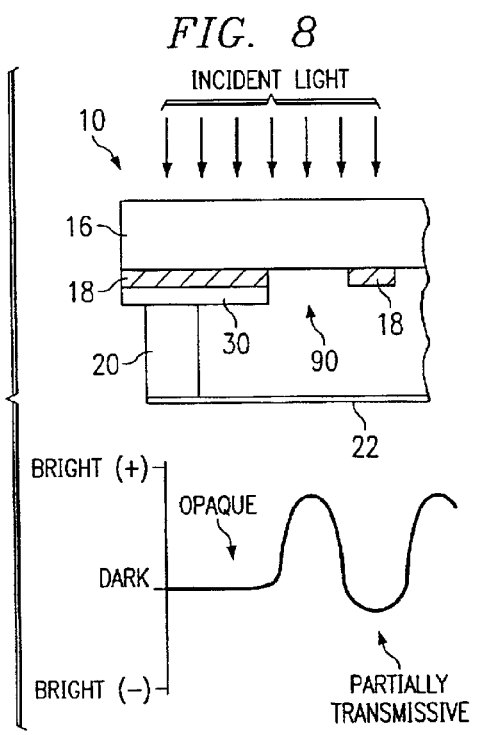
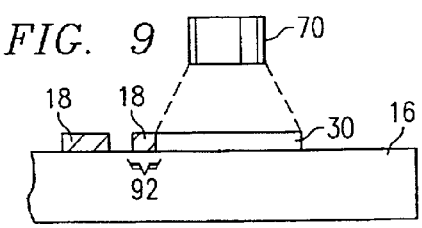

PHOTOMASK AND METHOD FOR FORMING AN OPAQUE BORDER ON THE SAME

CROSS REFERENCE TO RELATED APPLICATION

This application claims priority from U.S. Provisional Patent Application Serial No. 60/279,060, filed Mar. 27, 2001 by Gregory P. Hughes, et al., and entitled "Opaque Borders for Embedded Phase Shift Masks."

TECHNICAL FIELD OF THE INVENTION

This invention relates in general to photolithography and, more particularly, to a photomask and a method for forming an opaque border on the same.

BACKGROUND OF THE INVENTION

Phase shift masks improve wafer imaging by using both the intensity and phase of electromagnetic radiation (EMR) in a photolithography system to improve the image contrast on a wafer. Phase shift masks can generally produce smaller geometries on wafers than traditional binary masks. While a binary mask generally only modulates the amplitude of the EMR, a phase shift mask typically modulates both the amplitude and the phase of the EMR in a way that may improve resolution of a projected image.

One particular type of phase shift mask, known as an embedded phase shift mask, typically includes a patterned layer of partially transmissive material disposed on a transparent substrate. The patterned layer is generally located in an area to be imaged onto a wafer (e.g., in a mask field). However, rather than being opaque to an exposure wavelength, the patterned layer generally transmits a small percentage (e.g., approximately one to thirty percent) of the exposure EMR. A common material used in embedded phase shift masks to form the partially transmissive layer is molybdenum silicide (MoSi). EMR that passes through the partially transmissive layer may be reduced in intensity and is typically one hundred and eighty degrees (180°) out of phase with respect to the EMR transmitted only through the transparent substrate. At the feature edges, the EMR passing through the transparent substrate may merge with the EMR passing through the partially transmissive layer to produce zero intensity as a result of the destructive interference. As a result, the image produced on the wafer often has sharper edges and a better resolution than an image produced by a binary mask.

An embedded phase shift mask may be a weak phase shift mask, in which the amount of the phase shift is proportional to the percentage of EMR transmitted through the partially transmissive layer. If the partially transmissive layer has a low transmission, the increase in resolution of the image on the wafer may be small. If the partially transmissive layer has a high transmission, the increase in resolution may be greater, but any additional exposure due to background illumination may become strong enough to create an exposed area that was designed to be unexposed. Consequently, in a photolithography system using a weak phase shift mask, EMR transmission by the mask should typically be strictly limited to the mask field.

For a binary mask, it may be possible to reduce transmission of background EMF by leaving the chrome layer that was used to define the pattern on the border regions. In embedded phase shift masks, however, the MoSi layer may transmit more EMR than is allowable outside of the mask field. For instance, EMR through the MoSi may double the background exposure around the edges of the mask field and quadruple background exposure at the corners of the mask field.

A field aperture and possibly other elements, such as stepper blades, may be used in an attempt to prevent EMR transmission from any border regions (i.e., regions outside the mask field). For instance, stepper blades may prevent EMR from reaching the wafer via peripheral structures located in border regions. However, the aperture, stepper blades, and other elements may not be exact, and the lithography system may still suffer from excess background illumination.

One solution to this problem involves using two patterning operations to create an embedded phase shift mask with two patterned layers. Such a process is described in U.S. Pat. No. 5,741,613 (hereinafter, the "613 patent"). The process in the 613 patent results in two patterned layers: one patterned layer formed from partially transmissive material and the other patterned layer formed from opaque material.

Specifically, in the process described by the 613 patent, a photomask blank includes a transparent substrate, a layer of partially transmissive material on the substrate, a layer of opaque material on the partially transmissive material, and a layer of resist on the opaque material. In a first patterning operation, a pattern is formed in the opaque and partially transmissive materials by selectively exposing then developing the resist, and then etching the opaque and partially transmissive layers in the regions no longer covered by the resist. The first resist layer is then removed. Then, in a second patterning operation, a second resist layer is formed on the mask, covering the patterned opaque and partially transmissive layers. The second layer of resist is exposed in the shape of a large window the size of the desired mask field. Also, the second patterning operation includes the steps of developing the resist and removing the opaque material from the areas no longer covered by the resist. Any remaining resist is then removed, to leave an opaque layer covering the border region of the mask surrounding the mask field. The opaque layer may absorb exposure EMR and thereby prevent any EMR that strikes the border region from being exposed onto the wafer.

However, masks are costly to manufacture in the manner described by the 613 patent, since two patterning operations are required. Also, when initially preparing the photomask blank, mask defects may be created during deposition of the partially transmissive layer on the transparent substrate, and during deposition of the opaque layer on the partially transmissive layer. Such masks will therefore typically have approximately twice the number of blank defects than for a binary mask that only requires one layer.

SUMMARY OF THE INVENTION

In accordance with the teachings of the present invention, disadvantages and problems associated with producing a photomask with an opaque border around a mask field have been substantially reduced or eliminated.

In an example method of manufacturing a photomask, no more than one patterning operation is used to form a mask field with a pattern of features and a border region substantially covered by an opaque material substantially surrounding the mask field. The mask field may include partially transmissive material. When the photomask is used to expose a pattern on an object, the opaque material may substantially prevent electromagnetic radiation (EMR) from passing through the border region.

In accordance with one embodiment of the present invention, when the mask field is formed, an insulating clear region may be formed in the mask field surrounding the pattern, and the border may be disposed outside the insulating clear region. The opaque layer may then be deposited onto the border region and adhered to the border region by electrodeposition.

In accordance with another embodiment of the present invention, the opaque material may be adhered to the border by selectively spraying the opaque material into the desired coverage areas, for example in a process like ink-jet printing. For embodiments in which the opaque material is printed onto the border region, the insulating clear region may be omitted.

A technical advantage of certain embodiments of the present invention is that the insulating clear region substantially prevents the opaque material from being deposited on or adhering to features in the pattern.

Another technical advantage of certain embodiments of the present invention is that the photomask may be manufactured with a single patterning operation. Other technical advantage of certain embodiments may include reduced manufacturing time, reduced manufacturing expense, reduced mask defects.

All, some, or none of these technical advantages may be present in various embodiments of the present invention. Other technical advantages will be readily apparent to one skilled in the art from the following figures, descriptions, and claims.

BRIEF DESCRIPTION OF THE DRAWINGS

A more complete understanding of the present invention and advantages thereof may be acquired by referring to the following description, drawings, and claims. In the drawings:

FIGS. 6A and 6B illustrate schematic cross-sectional views with portions broken away of a photomask at various stages of an alternative manufacturing process incorporating teachings of the present invention;

FIG. 7 illustrates a flowchart of an example process for fabricating and using a photomask with an opaque border;

FIG. 8 illustrates a graph of transmission characteristics for a selected portion of a photomask such as shown in FIG. 1; and FIG. 9 illustrates a schematic cross-sectional view with portions broken away of an alternative embodiment of a photomask incorporating teachings of the present invention.

DETAILED DESCRIPTION

For the purposes of this document, a "patterning operation" is a process that includes at least the following three steps: (a) exposing an image into a layer of photoresist, (b) developing that photoresist to selectively uncover material, and (c) removing at least some of the selectively uncovered material. Similarly, a "patterned layer" is a stratum of material that is left on a substrate such as a photomask as the end result of a patterning operation.

Figure 1:
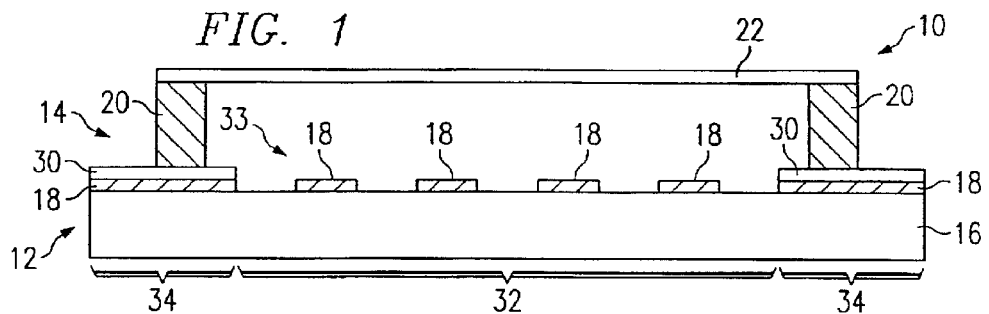
FIG. 1 illustrates a schematic cross-sectional view of an example photomask with an opaque border.

FIG. 1 illustrates a cross-sectional view of an example embodiment of photomask assembly 10 incorporating teachings of the present invention. Photomasks according to the present invention may also be called masks or reticles, and they may have a variety of sizes and shapes, including but not limited to round, rectangular, or square. Photomasks according to the present invention may also be any variety of photomask types, including, but not limited to, a one-time master, a five-inch reticle, a six-inch reticle, or any other size reticle suitable to project an image of a circuit pattern onto a wafer.

Figure 3:
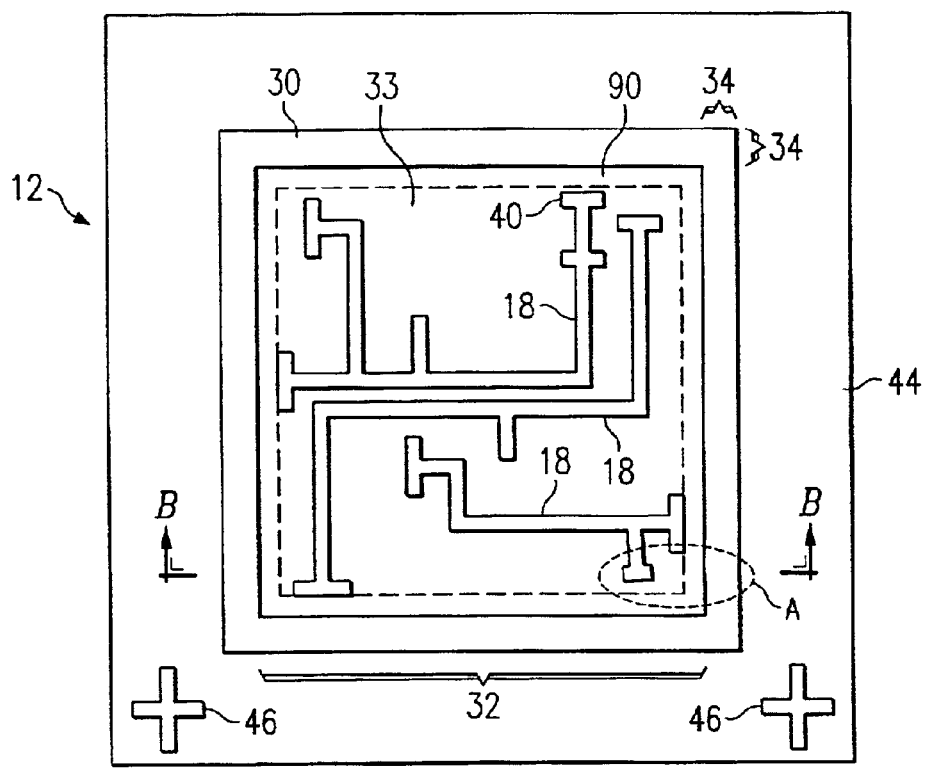
FIG. 3 illustrates a schematic top view of the photomask of FIG. 1.

In the example embodiment, photomask assembly 10 includes a photomask 12 coupled to a pellicle 14. A substrate 16, a patterned layer 33 of optical absorber 18, and an opaque layer 30 form photomask 12. In the example embodiment depicted in FIGS. 1 and 3, opaque layer 30 covers a border region 34 that surrounds a mask field 32. Within mask field 32, optical absorber 18 and complementary areas of bare substrate 16 define patterned layer 33, such as a circuit image, on a surface of photomask 12. Patterned layer 33 may also be referred to as pattern 33. The dashed box surrounding pattern 33 in FIG. 3 represents the outer perimeter of pattern 33 and also the inner edge of an insulating clear region 90, which is described below.

Frame 20 and pellicle film 22 form pellicle 14. Pellicle film 22 may be a thin film membrane formed of a material such as nitrocellulose, cellulose acetate, an amorphous fluoropolymer, such as Teflon® AF manufactured by E. I. du Pont de Nemours and Company, or another suitable deep ultraviolet film. Pellicle film 22 may be prepared by a conventional technique such as spin casting. Frame 20 is typically formed of anodized aluminum, although it could alternatively be formed of stainless steel, plastic or other suitable materials.

For some applications, substrate 16 may be a substantially transparent material, such as quartz, synthetic quartz, fused silica, magnesium fluoride ($MgF_2$), calcium fluoride ($CaF_2$), or any other suitable material that transmits approximately seventy-five percent or more of incident EMR having a wavelength between approximately 120 nanometers (nm) and approximately 450 nm. An optical absorber 18 may form patterned layer 33. In one example embodiment, optical absorber 18 is a partially transmissive material, such as molybdenum silicide (MoSi). In alternative embodiments, other materials may be used for patterned layer 33. For instance, the optical absorber may be a metal material such as chrome, chromium nitride, a metallic oxy-carbo-nitride (where the metal is selected from the group consisting of chromium, cobalt iron, zinc, molybdenum, niobium, tantalum, titanium, tungsten, aluminum, magnesium and silicon), or any other suitable material that completely or partially absorbs EMR with wavelengths between approximately 120 nm and approximately 450 nm.

As described in greater detail below, photomask 12 may be formed from a photomask blank using a lithography process. For instance, a mask pattern file that includes data for pattern 33 may be generated from a circuit design pattern. The desired pattern may be imaged into a resist layer of the photomask blank using a laser, electron beam or X-ray lithography tool. In one embodiment, the lithography tool may use an Argon-Ion laser that emits EMR having a wavelength of approximately 364 nanometers (nm). In alternative embodiments, the lithography tools may use lasers emitting EMR at wavelengths from approximately 150 nm to approximately 300 nm. After manufacture of photomask assembly 10 is complete, photomask assembly 10 may be used in a lithography system to image other objects, such as semiconductor wafers, as described below with reference to FIG. 2.

FIG. 3 illustrates a top view of photomask 12 and shows an area 32 of photomask 12 to be imaged onto a wafer. Area 32 may also be referred to as mask field 32. In the illustrated embodiment, mask field 32 includes pattern 33. As described earlier, pattern 33 includes areas of partially transmissive material 18 and bare areas of substrate 16. Bare areas of substrate 16 may also be referred to as apertures. The partially transmissive material may be MoSi or any other suitable material that transmits approximately one to thirty percent of exposure EMR with respect to a wavelength of exposure, and creates a phase shift of one hundred and eighty degrees (180°) with respect to an aperture of the transparent substrate. Other types of optical absorbers, such as chrome, may form the pattern in alternative embodiments. Mask field 32 is surrounded by a border region 34 that is covered with a layer of partially transmissive material 18 and a layer of opaque material 30. As described in greater detail below, mask field 32 includes an insulating clear region 90 disposed between the features in mask field 32, such as feature 40, and border region 34.

Figure 4:
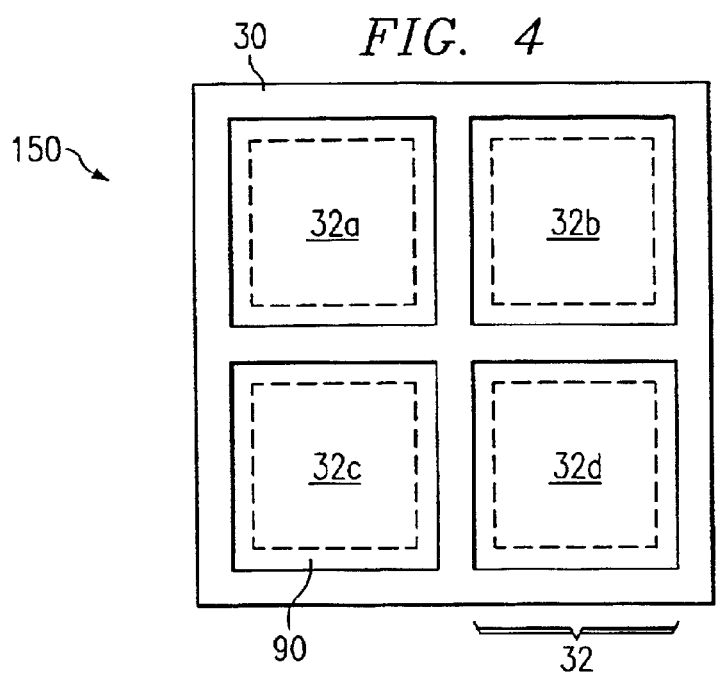
FIG. 4 illustrates a schematic top view of an alternative embodiment of a photomask with an opaque border.

FIG. 4 illustrates an alternative photomask 150 that features four mask fields designated 32a, 32b, 32c, and 32d; respective insulating clear regions 90 surrounding each mask field 32a, 32b, 32c, and 32d at the perimeter of each mask field 32a, 32b, 32c, and 32d; and a border of opaque material 30.

Figure 2:
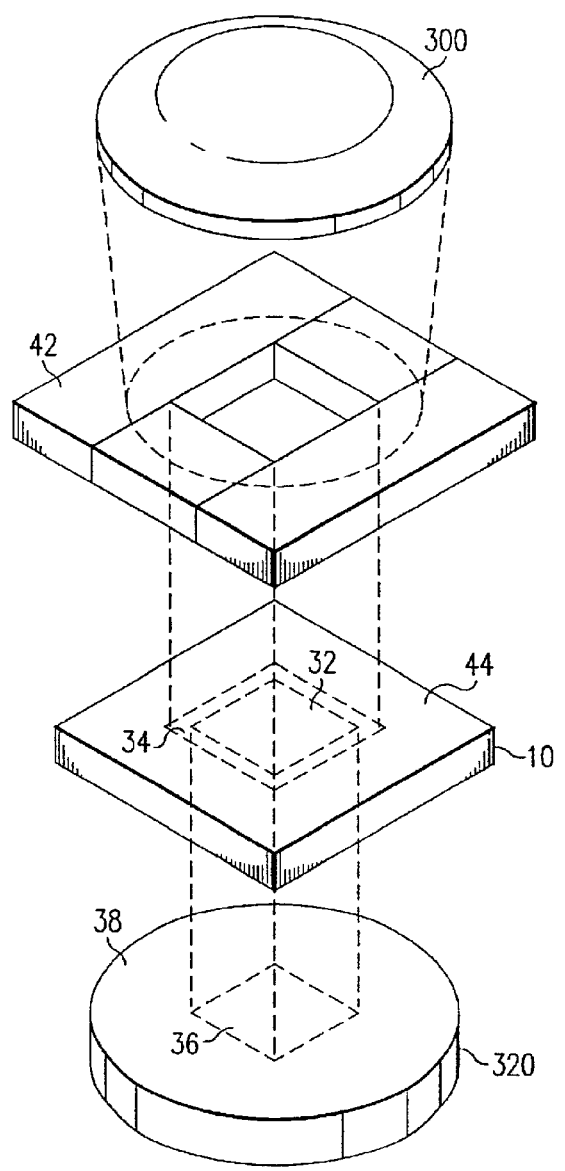
FIG. 2 illustrates a schematic isometric view of a photomask being used to image a wafer.

Referring now to FIG. 2 and 8, when photomask assembly 10 is used in a lithography system, electromagnetic radiation (EMR) from an energy source 300 is projected onto photomask 12. Examples of such EMR may include, without limitation, ultra violet, deep ultra violet (DUW), extreme ultra violet (EUV) and X-rays. Stepper blades 42 may be used to shape the beam of EMR to correspond more closely to mask field 32, as depicted by the dashed lines in FIG. 2 between stepper blades 42 and photomask assembly 10. For instance, with reference also to FIG. 3, stepper blades 42 may be used to prevent EMR from striking peripheral regions 44 of photomask 12 outside border region 34, thereby preventing peripheral structures, such as alignment marks 46, from being exposed onto the object being imaged.

However, as shown in FIG. 2, it may be difficult or impossible for stepper blades 42 to shape the beam of EMR precisely enough to strike all of mask field 32 and none of peripheral region 44 outside of mask field 32. As illustrated by the dashed lines between photomask assembly 10 and wafer 320, in the example embodiment, opaque layer 30 in border region 34 serves to prevent any undesired exposure that might otherwise occur as a result of the relatively imprecise operation of stepper blades 42.

For transmissive systems, the EMR passes through substrate 16, and the circuit image from pattern 33 in mask field 32 is projected onto the surface of an object being imaged, such as a semiconductor wafer 320. The area of semiconductor wafer 320 that receives the EMR transmitted through mask field 32 is known as the image field 36. As depicted in FIG. 8, in the example embodiment, opaque material 30 may be applied to the topside of the photomask (i.e., the side with the pattern of optical absorber). As evident from FIGS. 8 and 2, when photomask assembly 10 is used to image wafer 320, EMR may be projected onto photomask assembly 10 from the backside (i.e., the side opposite the topside), and opaque layer 30 may prevent the EMR from passing through border region 34 and exposing areas of wafer 320 outside image field 36. Opaque layer 30 on border region 34 thus serves to ensure that image field 36 corresponds precisely to mask field 32. For instance, opaque layer 30 may prevent the EMR from striking non-target regions 38 of semiconductor wafer 320 (i.e., regions outside of image field 36) and may prevent EMR that strikes border region 34 from causing background exposure on semiconductor wafer 320. For example, the lithography system may step across wafer 320 to expose a series of image fields 36, and the opaque border may prevent partial illumination of adjacent image fields.

The width of border region 34 may vary for different implementations, and a typical implementation may use a width in the general range from approximately one millimeter (mm) to approximately ten mm. A width of approximately five mm may be used in the example embodiment. In other embodiments, the opaque layer may extend from the mask field to the edge of the substrate. However, in such embodiments, it may be preferable to make provisions for peripheral structures such as alignment marks within the opaque layer.

For reflective systems, such as EUV systems, the operations for using a photomask with an opaque border according to the present invention may be similar, but the exposure EMR may be reflected from the photomask face onto the wafer, rather than passing through the substrate.

FIGS. 5A–5G illustrate schematic cross-sectional views with portions broken away of the photomask of FIG. 1 in various stages of a manufacturing process incorporating teachings of the present invention. Specifically, FIGURES 5A–5G depict a cross section, taken along line B, of the part of photomask assembly 10 surrounded by dashed circle A, at various stages in the fabrication process that culminates when photomask assembly 10 is completed.

FIGS. 6A and 6B illustrate schematic cross-sectional views with portions broken away of a photomask at various stages of an alternative manufacturing process incorporating teachings of the present invention. The process associated with FIGS. 6A and 6B is similar to the process for FIGS. 5A–5G. However, FIGS. 6A–6B involve using a nozzle 70, such as an ink-jet printhead, to deposit the opaque material, while FIGS. 5E–5G involve electrodeposition of the opaque material.

FIG. 7 presents a flowchart of an example manufacturing process corresponding to the stages shown in FIGS. 5A–5G. That process begins with a photomask blank that includes a transparent substrate 16, a layer of optical absorber 18 that coats a surface of transparent substrate 16, and a layer of photoresist 54 that coats optical absorber 18. For purposes of this document, the term "photoresist" is used broadly to include resist materials activated by EMR, resist materials activated by electron beams, and any other suitable types of resist materials. In the example embodiment, optical absorber 18 may be a partially transmissive material, such as MoSi, for example. However, as described in greater detail below, in alternative embodiments other materials may be used for the optical absorber, including substantially opaque materials, which may be referred to generally as chrome.

Figure 5A:
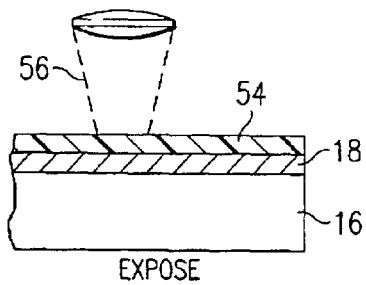
FIGS. 5A–5G illustrate schematic cross-sectional views with portions broken away of the photomask of FIG. 1 in various stages of a manufacturing process incorporating teachings of the present invention.

As shown at block 200 and in FIG. 5A, the photomask manufacturer exposes the mask field in photoresist 54 using an electron beam or laser beam 56, for instance. In the example embodiment, the mask field is designed to include a pattern and an insulating clear region around the pattern. For instance, in FIG. 3, insulating clear region 90 is depicted at the perimeter of mask field 32, surrounding pattern 33. In some embodiments, the insulating clear region may be omitted, as described below.

Figure 5B:
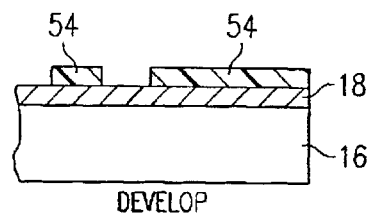

As depicted in block 202 and FIG. 5B, photoresist 54 is then developed, which causes portions of photoresist 54 to be removed according to the mask field exposed in the previous step. In the example embodiment of FIGS. 5A–5G, a positive resist process is used, in which a developer dissolves the areas of photoresist 54 that have been exposed, to uncover regions of optical absorber 18. However, negative photoresist may be used in alternative embodiments. For example, the photoresist may be a positive or negative diazo-napthaquinone(DNQ) photoresist or any other photoresist for use in a lithography system using approximately 150 nm to approximately 450 nm EMR.

Figure 5C:
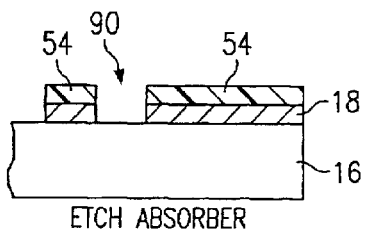

As shown in block 204 and FIG. 5C, the manufacturer then forms the pattern in optical absorber 18 by etching away optical absorber 18 in the areas that have been cleared of photoresist 54. The etch may be performed by a wet etch process or a dry etch process. The etching step removes areas of optical absorber 18 to expose areas of transparent substrate 16. One of the exposed areas of substrate 16 is insulating clear region 90. However, in one example embodiment, a layer of optical absorber 18 is left covering border region 34. In some embodiments, the insulating clear region may be omitted, as described below.

Insulating clear region 90 may isolate features in pattern 33 from the layer of optical absorber 18 on border region 34, as illustrated in FIG. 3 by the space between border region 34 and the dashed box at the perimeter of pattern 33. For instance, insulating clear region 90 may introduce spatial separation between border region 34 and features in pattern 33, and insulating clear region 90 may insulate pattern 33 from electrical current flowing through border region 34.

Figure 5D:
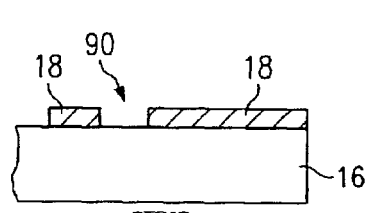

After optical absorber 18 has been etched, photoresist 54 is stripped from the blank, as shown in FIG. 5D and in block 210 of FIG. 7. At this point, the photomask may be referred to as a patterned substrate.

Figure 5E:
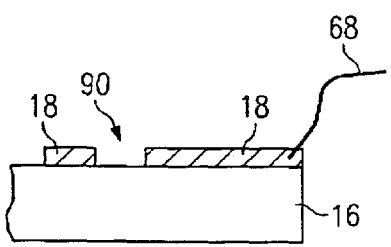
Figure 5F:
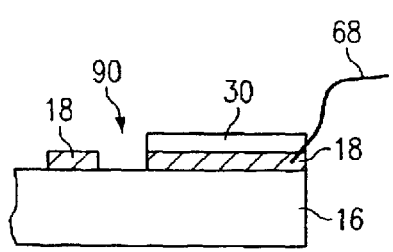
Figure 5G:
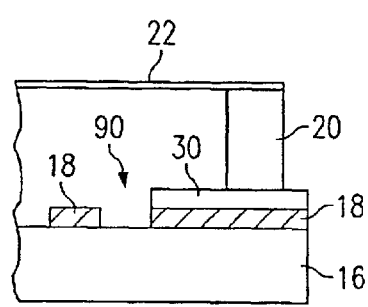

As indicated in block 212 and FIG. 5E, an electrode 68 is then attached to the optical absorber 18 covering border region 34. The blank is then placed into a plating solution and an electrical potential is applied to the border region surrounding the mask field to cause a thin layer of plating metal to adhere to optical absorber 18 in the border region to form opaque layer 30. For instance, as shown in FIG. 3, border region 34 may extend from the edge of transparent substrate 16 to the edge of mask field 32. Border region 34 may be completely coated with opaque layer 30 by the electroplating process.

During electroplating, insulating clear region 90 acts as a barrier to the electric current and prevents the plating metal from adhering to the pattern. The plating metal only needs to be thick enough to make the border region opaque to an exposure wavelength emitted in a photolithography system. Any metallic electroplate that provides good adhesion to the partially transmissive layer, has adequate opacity, and has a low defect density during processing of the mask (e.g., from electroplating through mask cleaning) may be used. As indicated in block 216 and 218 and FIG. 5G, steps to complete fabrication of photomask assembly 10 may include removing electrode 68 and attaching pellicle 14.

In an alternative embodiment, a printing process with low resolution (relative to the resolutions available through lithography) may be used to deposit an opaque layer in the border region. For example, the operations described in blocks 212 and 216 may be omitted, and for block 214 a process like ink-jet printing may be used to form an opaque border around the mask image. In such a process, the blank may or may not include a layer of optical absorber in the border region. Also, if the blank does include a layer of optical absorber in the border region, the blank may or may not include an insulating clear region between the features in the pattern and the layer of optical absorber in the border region. A computer may be used to print a desired pattern of opaque material on the mask within the border region.

In the example embodiment illustrated in FIG. 6A, optical absorber 18 is left on the border region, and optical absorber 18 (e.g., the inner edge 72 thereof) may be used as an alignment feature to guide a nozzle 70, such as an ink-jet printhead, when spraying opaque material 30 onto the border region. Since insulating clear region 90 ensures some distance between border region 34 and the features in pattern 33, the opaque border does not have to be high resolution, thus allowing the printing process to be used. Any material that may be deposited with a printhead, provides good adhesion and good opacity, and has a low defect density may be used. As depicted in block 218 and FIG. 6B, pellicle 14 may then be attached to the photomask. The photomask may then be used to image an object such as a semiconductor wafer, as indicated in block 220.

As illustrated in FIG. 9, in an alternative embodiment, the border region may be clear of optical absorber except for an area 92 of optical absorber 18 forming an inner edge for the border region. That edge of optical absorber may then be used as an alignment feature when spraying opaque material onto the border region. In addition, although certain figures illustrate border region 34 extending to the edge of substrate 16, it should be understood that peripheral areas of substrate 16 may extend beyond border region 34, as shown in FIG. 9.

In embodiments with an opaque layer on the border region and an insulating clear region, the photomask manufacturer may prefer to use an opaque material that adheres to the opaque layer but not to the substrate in the insulating clear region. In embodiments with the border region substantially clear of optical absorber, the photomask manufacturer may prefer to use an opaque material that adheres both to the opaque layer and to the substrate or one that adheres only to the substrate.

FIG. 8 illustrates a graph of the transmission characteristics of embedded phase shift mask assembly 10 with a partially transmissive material such as MoSi used as optical absorber 18. In the transparent regions of the pattern (i.e., the apertures), most of the exposure EMR from the photolithography system is transmitted through transparent substrate 16 and forms a bright region on the surface of a wafer. In the areas of the pattern covered by partially transmissive layer 18, some of the EMR is transmitted onto the wafer. As shown on the graph, that EMR is 180 degrees out of phase with the EMR transmitted through the transparent regions. Where partially transmissive layer 18 is adjacent to the transparent regions, the EMR transmitted through partially transmissive layer 18 destructively interferes with the EMR transmitted through the transparent regions. The destructive interference causes the edges of the features to be sharper on the wafer and creates features with finer resolutions on the wafer. In the border areas of the mask covered by opaque material 30, no EMR is transmitted onto the wafer, which creates a dark region on the surface of the wafer. Therefore, exposure of the wafer is limited to the intended image field.

Technical advantages of certain embodiments of the present invention include an embedded phase shift mask that provides an opaque border around a mask field, so that exposure is precisely limited to the desired image field. Although conventional embedded phase shift masks may include an opaque layer disposed on the partially transmissive layer between the edges of the mask field and the transparent substrate, the additional process steps used in conventional photomask manufacturing processes to create the opaque layer present certain disadvantages, such as increased manufacturing time, increased manufacturing expense, and an increased likelihood of defects in the masks. With the present invention, an opaque material may be formed on the border region of the mask (e.g., by electroplating or deposition printing) without introducing or adhering any contaminants onto the pattern in the mask field.

Another technical advantage of certain embodiments of the present invention includes an embedded phase shift mask with a self-aligning opaque border. During pattern generation, a clear insulating region may be designed to surround a mask field. The mask field, including the insulating region, may be formed in a partially transmissive layer. The edges of the insulating region may then be used as a guide for depositing the opaque layer in the border region.

In certain embodiments, the process described herein may be used with optical absorbers, such as chrome. For instance, chrome, or any other suitable optical absorber with a relatively low optical density (OD) (e.g., an OD of one or two) may be used to form the pattern, and the process described herein may be used to create an opaque border with a higher OD (e.g., an OD of three or more). The photomask manufacturer may then benefit from the advantages associated with using a thinner layer to form the pattern, while also ensuring sufficient opacity in the border regions to prevent undesired peripheral exposure or background exposure on wafers.

In addition, an electroplated opaque border may be designed to enhance the contrast of peripheral structures such as pre-alignment, calibration pattern, and bar codes located outside the mask field. For instance, in an embedded phase shift mask, the border region may extend from an array of dies to the edge of the substrate, and peripheral structures may be etched into a layer of partially transmissive material in the border region. The contrast may be enhanced by electroplating opaque material onto the partially transmissive material but not onto the peripheral structures. Alternative photomasks may include some peripheral structures, such as bar code patterns and possibly pre-alignment marks, to which the opaque material may be adhered.

Although various example embodiments of the present invention have been described in detail, it should be understood that various changes, substitutions, and alterations to those embodiments can be made without departing from the spirit and scope of the invention as defined by the appended claims.

What is claimed is:

1. A method of manufacturing a photomask, the method comprising:
    forming a mask field on a topside of a photomask blank, the mask field having multiple features formed from a partially transmissive material;
    forming an opaque layer on the topside of the photomask blank on a border region substantially surrounding the mask field; and
    preventing the opaque layer from being formed on the features, whereby the opaque layer on the border region substantially prevents electromagnetic radiation (EMR) at an exposure wavelength from passing through the border region.

2. The method of claim 1, wherein:
    forming the mask field comprises forming an insulating clear region surrounding the features at a perimeter of the mask field; and
    forming the opaque layer comprises forming the opaque layer outside the insulating clear region.

3. The method of claim 1, wherein forming the mask field comprises:
    exposing a layer of photoresist on the photomask blank;
    developing the photoresist to form uncovered areas; and
    etching the partially transmissive material in the uncovered areas to create a pattern in the mask field, wherein the pattern includes the features and an insulating clear region separating the mask field from the border region having a layer of partially transmissive material formed thereon.

4. The method of claim 3, wherein forming the opaque layer comprises:
    attaching an electrode to the layer of partially transmissive material on the border region; and
    electroplating the opaque layer onto the layer of partially transmissive material.

5. The method of claim 1, wherein preventing the opaque layer from being formed on the features comprises using an insulating clear region to prevent the opaque layer from adhering to the features.

6. The method of claim 1, wherein forming the opaque layer comprises electroplating opaque material onto the border region.

7. The method of claim 1, wherein forming the opaque layer comprises spraying opaque material onto the border region.

8. The method of claim 1, wherein forming the opaque layer comprises printing opaque material onto the border region using an ink-jet printhead.

9. A photomask comprising:
    a mask field with features formed from a partially transmissive material on a topside of substantially transparent substrate, the mask field having a perimeter;
    a border region substantially surrounding the mask field at the perimeter of the mask field; and
    an opaque layer formed on the topside of the photomask on the border region, the opaque layer comprising a material selected from the group consisting of an electroplated material and a printed material, whereby the opaque layer substantially prevents electromagnetic radiation (EMR) at an exposure wavelength from passing through the border region.

10. The photomask of claim 9, wherein the opaque layer on the border region comprises material that has been electroplated onto the border region.

11. The photomask of claim 9, wherein the opaque layer on the border region comprises material that has been sprayed onto the border region.

12. The photomask of claim 9, further comprising:
    an electrically conductive material substantially covering the border region; and
    the opaque layer substantially covering the electrically conductive material.

13. The photomask of claim 12, wherein the opaque layer on the border region comprises a metallic electroplate.

14. The photomask of claim 9, further comprising:

an electrically conductive material substantially covering the border region; and an insulating clear region at the perimeter of the mask field, the insulating clear region isolating the features from the electrically conductive material, whereby the insulating clear region facilitates electroplating the border region and prevents the features in the mask field from being electroplated.

15. The photomask of claim 14, wherein:

the electrically conductive material comprises a partially transmissive material;

the insulating clear region comprises a ring of exposed substrate; and the opaque layer on the border region comprises a metallic electroplate.

16. A photomask assembly comprising:

a mask field with features formed from a Partially transmissive material on a topside of a substantially transparent substrate, the mask field having a perimeter, a border region substantially surrounding the perimeter of the mask field;

an opaque layer formed on the border region on the topside of the substantially transparent substrate, wherein the opaque layer comprises a material selected from the group consisting of an electroplated material and a printed material, whereby the opaque layer substantially prevents electromagnetic radiation (EMR) at an exposure wavelength from passing through the border region; and pellicle attached to the border region to cover the mask field.

17. The photomask assembly of claim 16, wherein the opaque layer comprises an electroplated opaque layer.

18. The photomask assembly of claim 16, wherein the opaque layer comprises a printed opaque layer.

19. The photomask assembly of claim 16, further comprising:

an electrically conductive material substantially covering the border region; and an insulating clear region at the perimeter of the mask field, the insulating clear region isolating the features from the electrically conductive material, whereby the insulating clear region facilitates electroplating the border region and prevents the features in the mask field from being electroplated.

20. A method of manufacturing a photomask, the method comprising using no more than one patterning operation to form a mask field including areas of partially transmissive material on a topside of the photomask and to cover a border region substantially surrounding the mask field with an opaque material on the topside of the photomask, with the mask field substantially free from the opaque material.

21. A method of exposing a pattern onto an object, the method comprising:

providing a photomask manufactured using the operations of (a) creating a mask field with features formed from a partially transmissive material on a topside of the photomask, and (b) adhering an opaque layer onto a border region on the topside of the photomask, wherein the border region substantially surrounds the mask field; and using the photomask to expose a pattern onto an object without exposing portions of the object outside an image field that corresponds to the mask field.

* * * * *